(12) United States Patent
Lin et al.

(10) Patent No.: US 9,937,536 B2
(45) Date of Patent: Apr. 10, 2018

(54) AIR PURGE CLEANING FOR SEMICONDUCTOR POLISHING APPARATUS

(75) Inventors: Kuo-Yin Lin, Hsin-Chu (TW); Chih-I Peng, Hsin-Chu (TW); Kun-Tai Wu, Hsin-Chu (TW); Teng-Chun Tsai, Tainan (TW); Hsiang-Pi Chang, New Taipei (TW); Cary Chia-Chiung Lo, Taipei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 1158 days.

(21) Appl. No.: 13/547,275

(22) Filed: Jul. 12, 2012

(65) Prior Publication Data

US 2014/0014136 A1   Jan. 16, 2014

(51) Int. Cl.
| | |
|---|---|
| *B08B 9/093* | (2006.01) |
| *H01L 21/67* | (2006.01) |
| *B24B 37/34* | (2012.01) |
| *B08B 5/02* | (2006.01) |

(52) U.S. Cl.
CPC ............. *B08B 9/093* (2013.01); *B24B 37/34* (2013.01); *H01L 21/67028* (2013.01); *B08B 5/02* (2013.01)

(58) Field of Classification Search
None
See application file for complete search history.

(56) References Cited

U.S. PATENT DOCUMENTS

| | | | | |
|---|---|---|---|---|
| 5,888,579 A | * | 3/1999 | Lun ...................... | C23C 16/4412 118/692 |
| 6,053,801 A | * | 4/2000 | Pinson ................... | B08B 17/02 451/444 |
| 6,472,326 B1 | * | 10/2002 | Holbrook ................. | B08B 5/02 118/629 |
| 2004/0033310 A1 | * | 2/2004 | Sarigiannis ......... | C23C 16/4401 427/248.1 |
| 2004/0142564 A1 | * | 7/2004 | Mullee ...................... | B08B 3/12 438/689 |
| 2008/0044567 A1 | * | 2/2008 | Seo ................... | H01L 21/28556 427/248.1 |
| 2008/0318494 A1 | * | 12/2008 | Hu .......................... | B24B 37/34 451/40 |
| 2009/0126760 A1 | * | 5/2009 | Banerjee .................. | B08B 3/02 134/1 |

* cited by examiner

*Primary Examiner* — Mikhail Kornakov
*Assistant Examiner* — Pradhuman Parihar
(74) *Attorney, Agent, or Firm* — Cooper Legal Group, LLC

(57) ABSTRACT

Among other things, one or more techniques and/or systems are provided for cleaning a polishing module of a semiconductor polishing apparatus. Purge air flow can be supplied into the polishing module (e.g., directed towards a polishing unit, a shield, and/or other polishing components) to create turbulence air flow within the polishing module. An auxiliary exhaust can be invoked to exhaust one or more particulates removed from the polishing module by the turbulence air flow. A purge air flow cycle can be performed by cycling the purge air flow and the auxiliary exhaust between on and off states. One or more purge air flow cycles can be performed during a main air flow cycle where laminar air flow is supplied into the polishing module and exhausted using a main exhaust. In this way, one or more particulates can be cleaned from the polishing module.

20 Claims, 8 Drawing Sheets

AIR PURGE CLEANING FOR SEMICONDUCTOR POLISHING APPARATUS

BACKGROUND

During fabrication of semiconductor devices on a semiconductor wafer, chemical mechanical polishing can be performed to smooth surfaces of the semiconductor wafer using chemicals and/or mechanical forces. For example, the semiconductor wafer can be polished by a semiconductor polishing apparatus (e.g., a chemical mechanical polisher (CMP)) to prepare the semiconductor wafer for a new layer of material. Particulates, such as airborne dust and chemical byproducts (e.g., As2O5, RuO4, PH3, gases, etc.), can result from, among other things, the fabrication process, the removal of material from the semiconductor wafer and/or the chemicals used during polishing.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

Among other things, one or more systems and/or techniques for cleaning a polishing module of a semiconductor polishing apparatus are provided herein. A semiconductor polishing apparatus, such as a chemical mechanical polisher, can comprise a polishing module. It can be appreciated that one example of a polishing module is illustrated in FIG. 1. The polishing module can comprise one or more polishing units (e.g., a polishing pad upon which a semiconductor wafer can be polished through chemicals and/or mechanical forces). A polishing unit can be shielded by one or more shields to contain materials and/or chemicals during polishing (e.g., the one or more shields can be positioned relative, such as surrounding, the polishing unit). Polishing can result in particulates that can interfere with polishing of semiconductor wafers (e.g., due to contamination). Laminar air flow can be supplied into the polishing module (e.g., across a polishing unit) to remove at least some particulates from the polishing module (e.g., airborne particulates above the polishing unit). A main exhaust can be invoked to exhaust at least some of the laminar air flow to expel particulates removed by the laminar air flow. The main exhaust can be used to maintain, regulate, etc. pressure within the polishing module when the laminar air flow is supplied into the polishing module. It can be appreciated that examples of supplying laminar air flow are illustrated in FIGS. 2 and 5A. Unfortunately, some particulates from the polishing module, such as particulates between the polishing unit and the one or more shields, can remain even in the presence of laminar air flow.

Accordingly, as provided herein, purge air flow can be supplied into the polishing module. For example, the purge air flow can be directed towards the polishing unit. The purge air flow can result in turbulence air flow between the polishing unit and the one or more shields. One or more particulates can be removed from the polishing unit and/or the one or more shields using the turbulence air flow. An auxiliary exhaust can be invoked to exhaust at least some of the turbulence air flow. In this way, one or more particulates, removed by the turbulence air flow, can be expelled from the polishing module by the auxiliary exhaust. The auxiliary exhaust can be used to maintain, regulate, etc. pressure within the polishing module when the purge air flow is supplied into the polishing module. In one example, the purge air flow and the auxiliary exhaust can be cycled between an on state and an off state to perform a purge air flow cycle to clean the polishing module. It can be appreciated that examples of supplying purge air flow are illustrated in FIGS. 3 and 5B.

To the accomplishment of the foregoing and related ends, the following description and annexed drawings set forth certain illustrative aspects and implementations. These are indicative of but a few of the various ways in which one or more aspects may be employed. Other aspects, advantages, and/or novel features of the disclosure will become apparent from the following detailed description when considered in conjunction with the annexed drawings.

DETAILED DESCRIPTION

Figure 1:
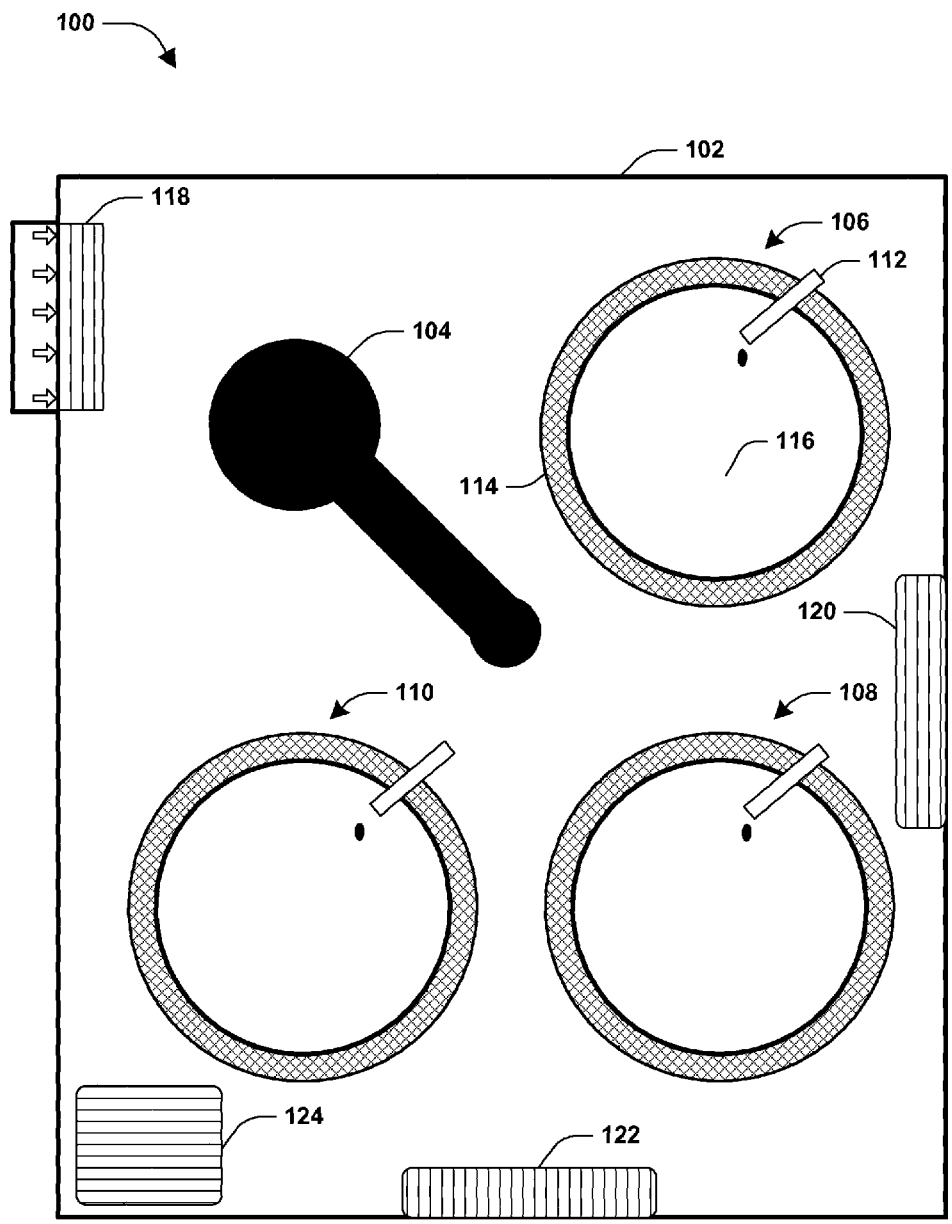
FIG. 1 is an illustration of an example of a polishing module of a semiconductor polishing apparatus.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, structures and devices are illustrated in block diagram form in order to facilitate describing the claimed subject matter.

FIG. 1 illustrates an example 100 of a polishing module 102 of a semiconductor polishing apparatus. The polishing module 102 can comprise one or more polishing units (e.g., a first polishing unit 106, a second polishing unit 108, a third polishing unit 110, etc.). A polishing unit, such as polishing unit 106, can comprise a polishing pad 116, a chemical depositor 112, and/or other components for polishing a semiconductor wafer. A shield 114 can be positioned relative to the polishing unit 106 to shield other components within the polishing module 102 from materials and/or chemicals that may be emitted from the polishing unit 106 during polishing. The polishing module 102 can comprise a polishing head 104. The polishing head 104 can be configured to secure (e.g., vacuum) a semiconductor wafer to the polishing head 104. The polishing head 104 can position the semiconductor wafer on a polishing pad for polishing. For example, the polishing head 104 can maneuver a semiconductor wafer onto the polishing pad 116, and can apply a force to the semiconductor wafer towards the polishing pad 116 while also rotating the semiconductor wafer. In this way, the polishing head 104 can rotate the semiconductor wafer against the polishing pad 116 to apply mechanical force against a surface of the semiconductor wafer to polish the semiconductor wafer (e.g., and the polishing pad 116 may be rotated as well during polishing). During polishing the chemical depositor 112 can deposit polishing chemicals (e.g., slurry) that can act as a solvent to facilitate the removal of material from the semiconductor wafer during polishing.

Figure 2:
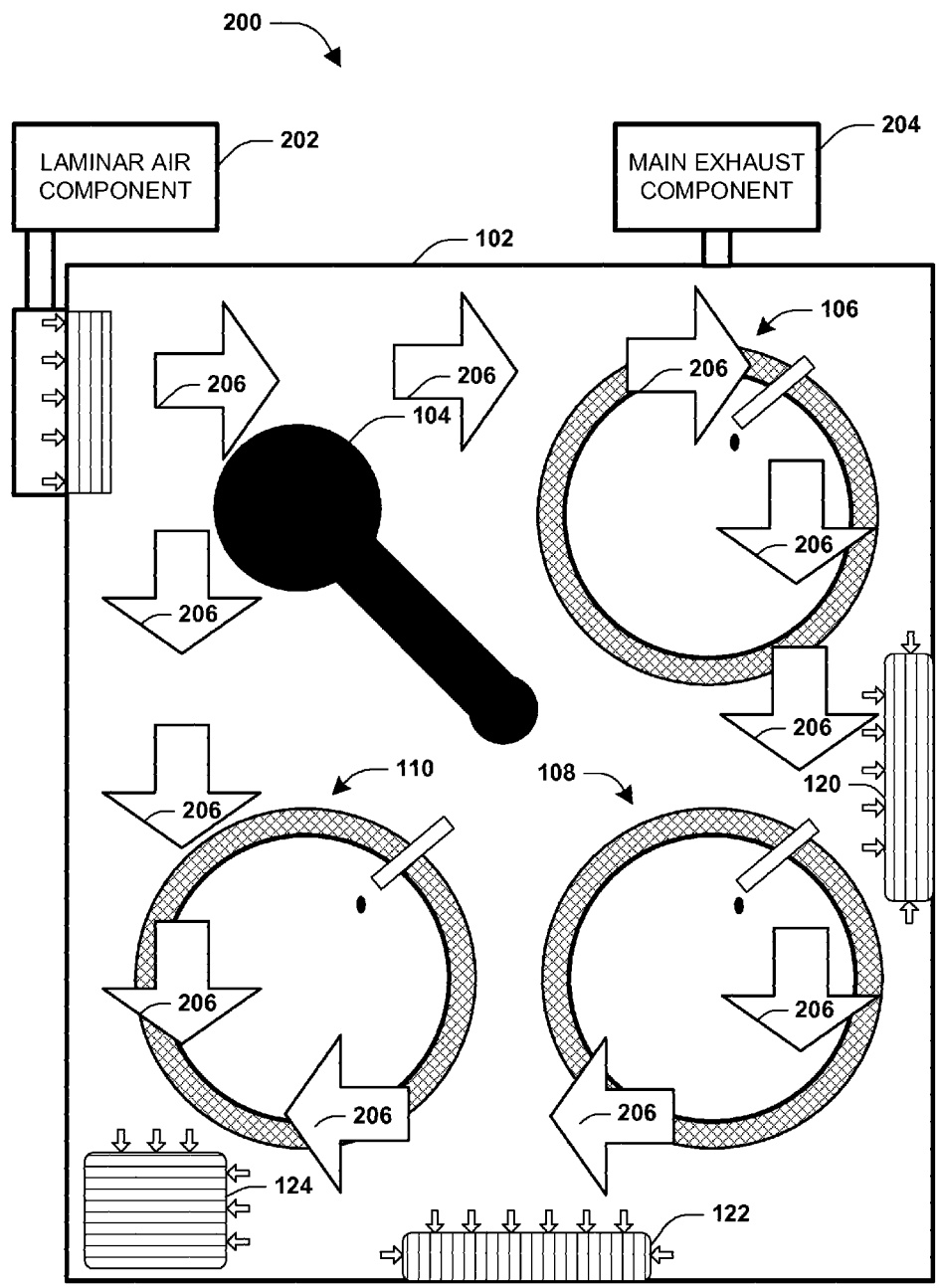
FIG. 2 is an illustration of an example of a laminar air component configured to supply laminar air flow to a polishing module.

During polishing, particulates (e.g., airborne dust, chemicals, gases, and/or other particles resulting from polishing) can accumulate within the polishing module 102. For example, particulates can accumulate on the polishing head 104, the one or more polishing units (e.g., the first polishing unit 106, the second polishing unit 108, the third polishing unit 110, and/or polishing components comprised therein), one or more shields within the polishing module 102 (e.g., shield 114), etc. Such particulates can negatively affect polishing of semiconductor wafers (e.g., through contamination). Accordingly, it can be advantageous to clean the polishing module 102 of particulates. Conventional cleaning techniques supply laminar air flow directed in a plane substantially parallel to (e.g., across) the one or more polishing units of the polishing module 102 (e.g., a laminar air fan 118 can circulate laminar air flow above the first polishing unit 106, the second polishing unit 108, the third polishing unit 110, the polishing head 104, etc.). A main exhaust (e.g., a first main exhaust 120, a second main exhaust 122, a third main exhaust 124, etc.) can be invoked to expel particulates removed by the laminar air flow. It can be appreciated that an example of laminar air flow within the polishing module 102 is illustrated in FIG. 2. Unfortunately, some particulate may remain in the polishing module 102 even in the presence of laminar air flow (e.g., between the polishing unit 106 and the shield 114)

FIG. 2 illustrates an example 200 of a laminar air component 202 configured to supply laminar air flow 206 to a polishing module 102. The polishing module 102 can comprise one or more polishing units, such as a first polishing unit 106, a second polishing unit 108, a third polishing unit 110, etc. The polishing module 102 can comprise a polishing head 104 configured to rotate semiconductor wafers against polishing pads within the one or more polishing units to polish the semiconductor wafers (e.g., mechanical force and/or chemicals can be applied to the semiconductor wafers to remove material and/or smooth irregular surfaces of the semiconductor wafers during polishing). Particulates (e.g., airborne dust, semiconductor fabrication materials, polishing chemicals, and/or byproducts from chemical mechanical polishing) can accumulate within the polishing module 102. For example, particulates can be airborne within the polishing module 102 and/or can accumulate on various polishing components, such as the polishing head 104 and/or the one or more polishing units. Because the particulates can interfere with polishing (e.g., causing contamination), at least some particulates can be cleaned from the polishing module 102 using laminar air flow 206.

Figure 3:
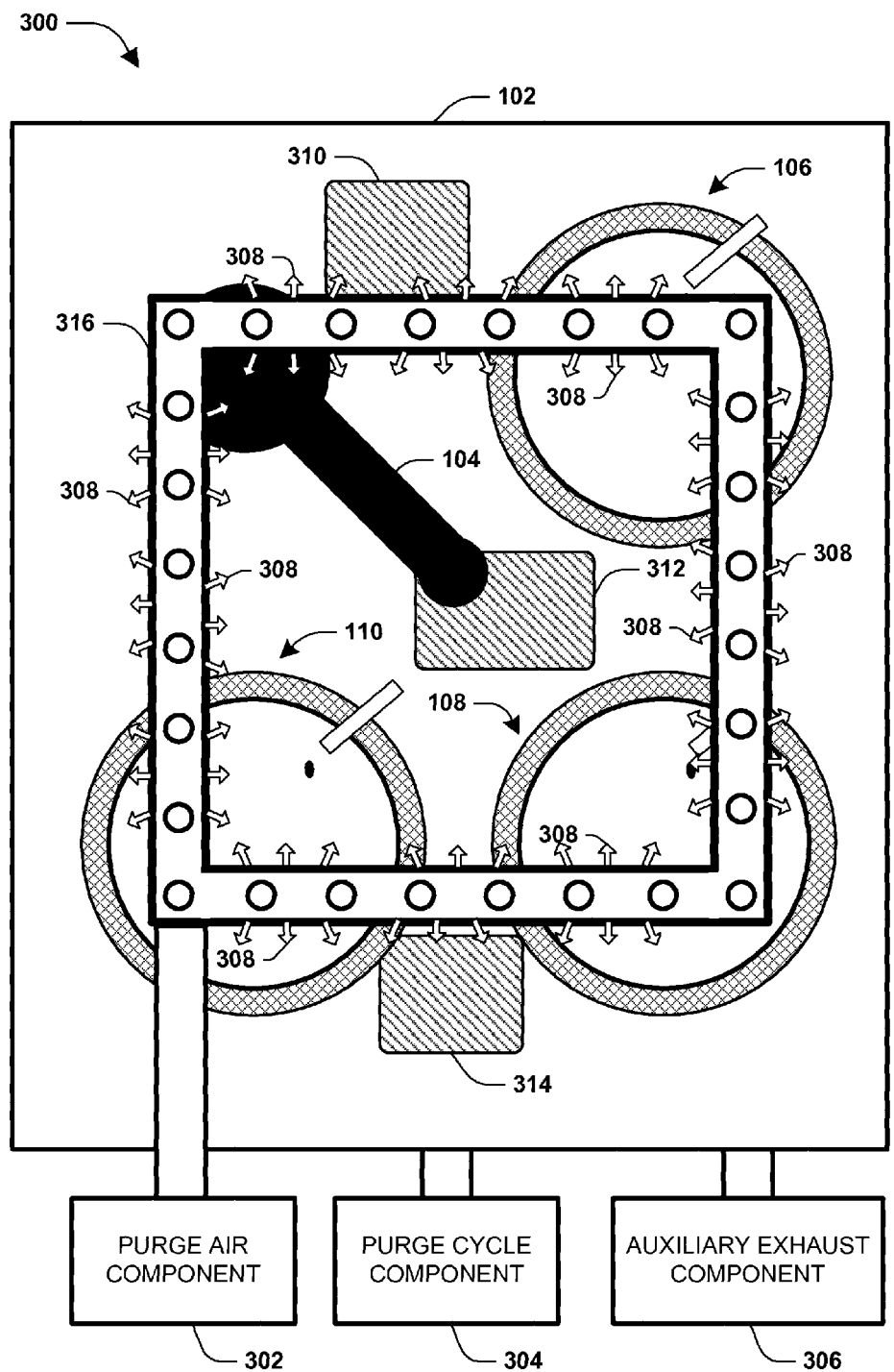
FIG. 3 is an illustration of an example of a purge air component configured to supply purge air flow towards one or more polishing units within a polishing module of a semiconductor polishing apparatus.
Figure 4:
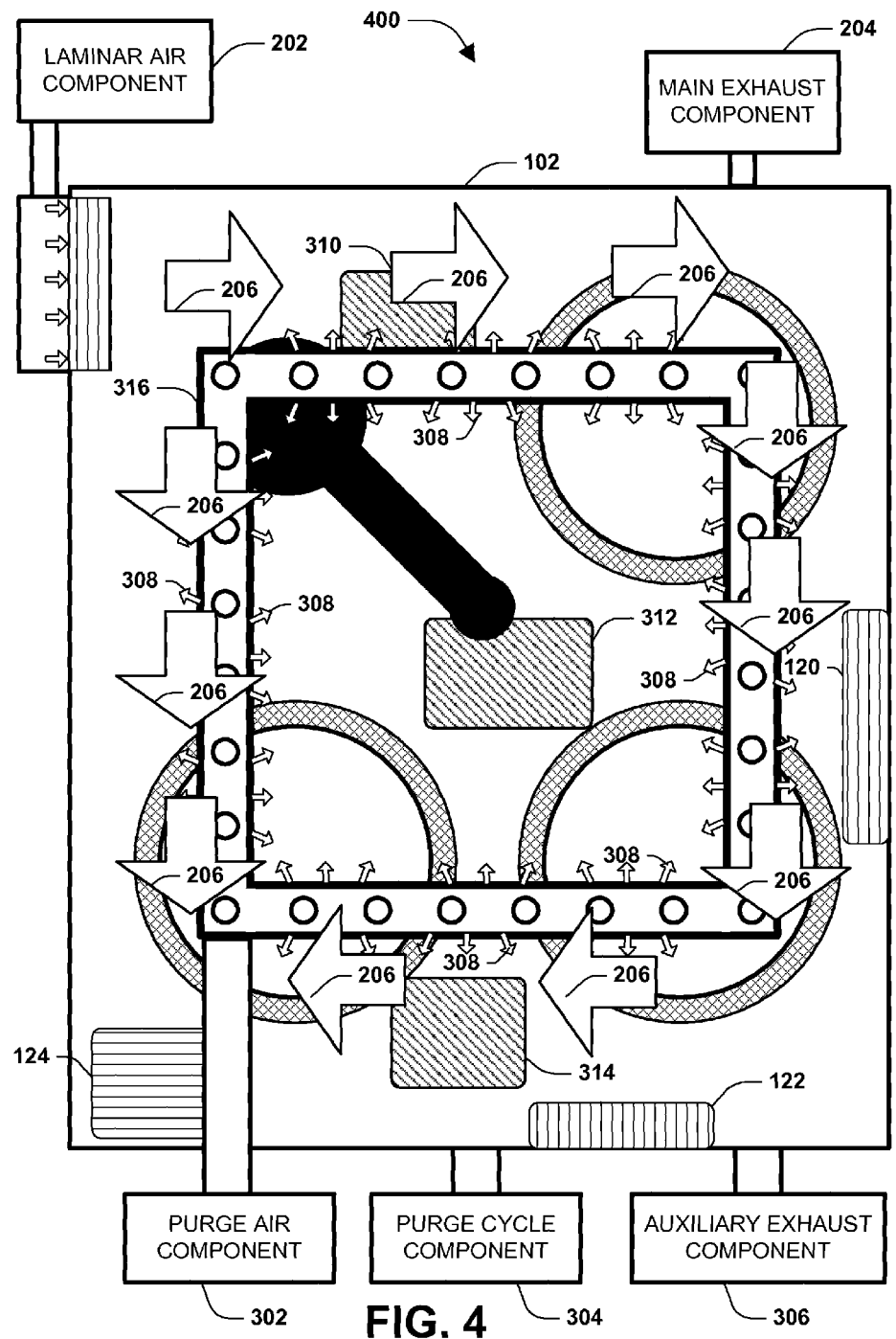
FIG. 4 is an illustration of an example of a system for cleaning one or more particulates from a polishing module.
Figure 5A:
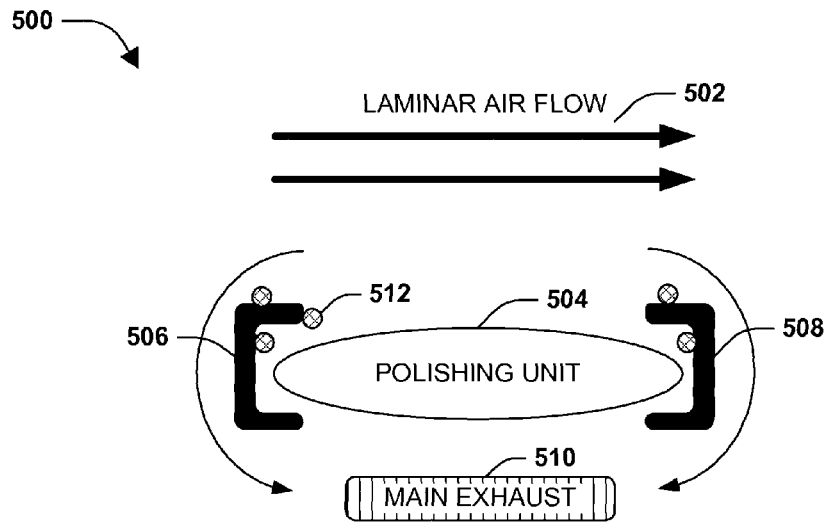
FIG. 5A is an illustration of an example of supplying laminar air flow across a polishing unit.
Figure 5B:
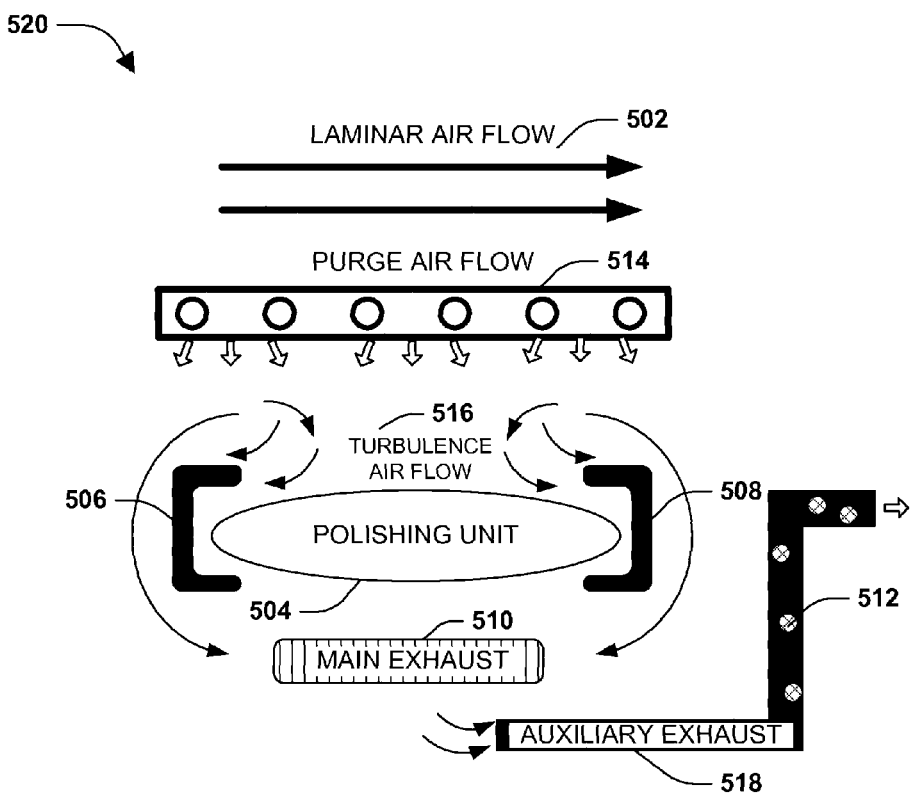
FIG. 5B is an illustration of an example of supplying laminar air flow and purge air flow to clean a polishing unit and/or other polishing components.
Figure 6:
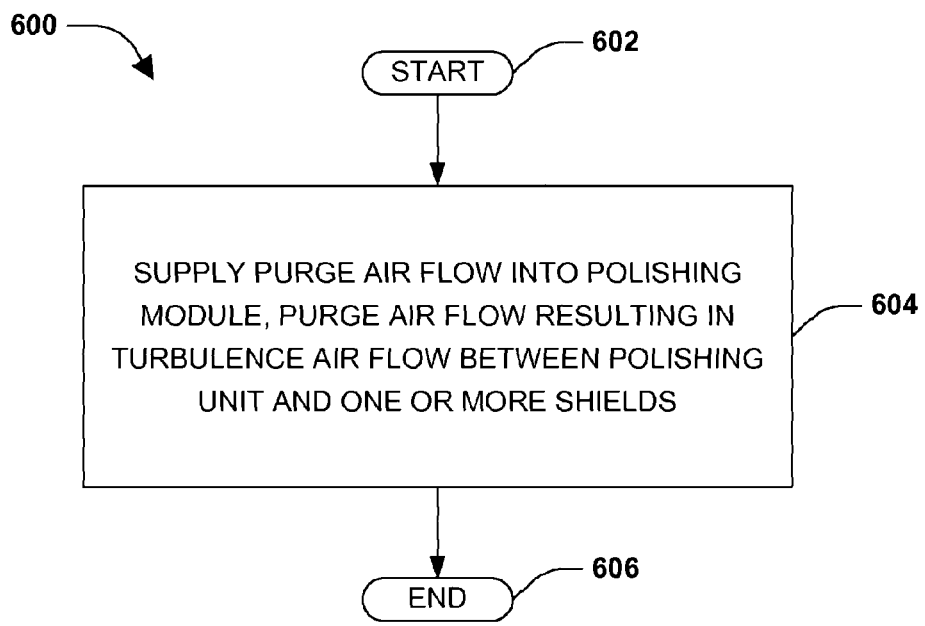
FIG. 6 is a flow diagram illustrating an example method of cleaning a polishing module of a semiconductor polishing apparatus.
Figure 7:
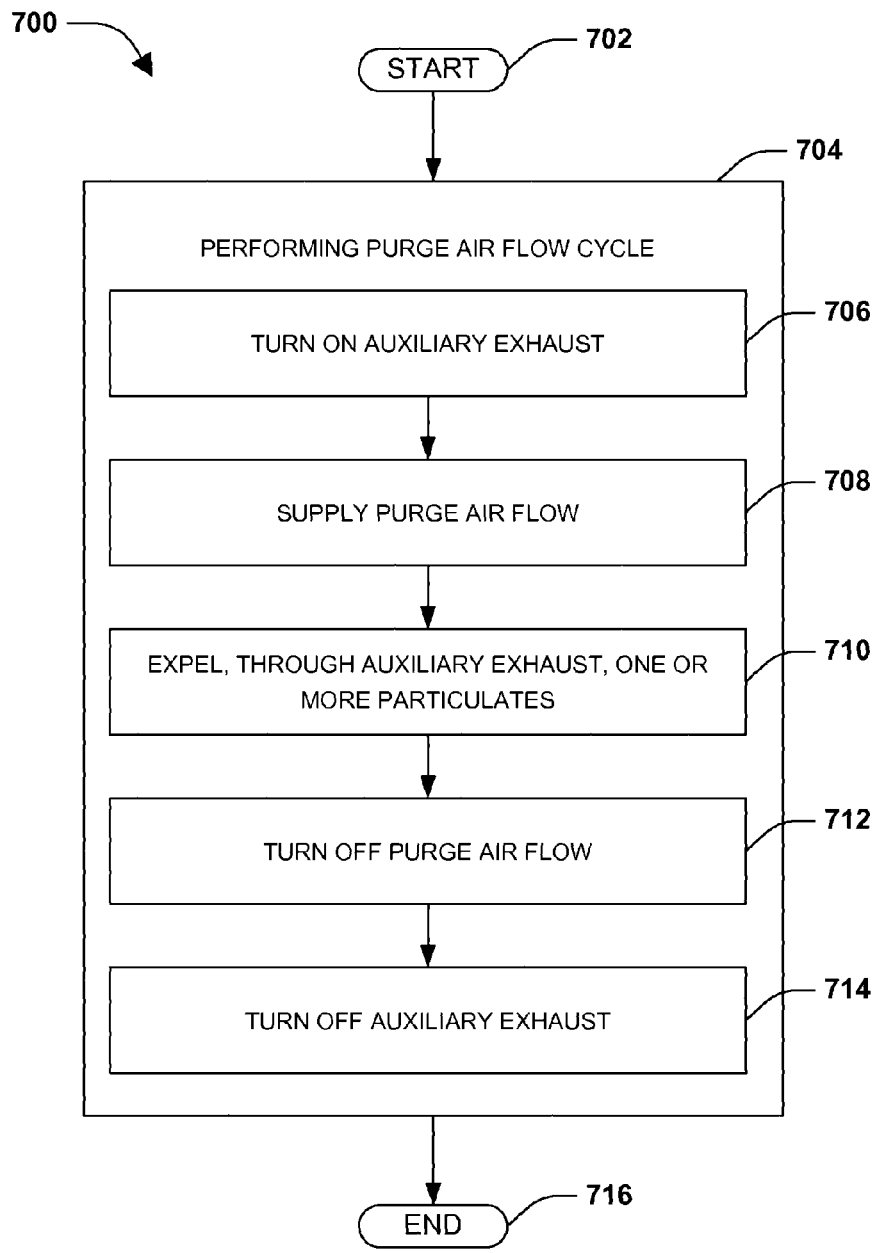
FIG. 7 is a flow diagram illustrating an example method of cleaning a polishing module of a semiconductor polishing apparatus.

In one example of cleaning the polishing module 102 with laminar air flow 206, the laminar air component 202 can be configured to supply laminar air flow 206 into the polishing module 102. For example, the laminar air component 202 can supply the laminar air flow in a plane substantially parallel with (e.g., across) the one or more polishing units within the polishing module 102. It can be appreciated that one example of supplying laminar air flow across a polishing unit is illustrated in FIG. 5A. A main exhaust (e.g., a first main exhaust mounted 120 to a side of the polishing module 102, a second main exhaust 122 mounted to the same or a different a side of the polishing module 102, a third main exhausted 124 mounted to a base plate of the polishing module 102, etc.) can be invoked to exhaust at least some of the laminar air flow 206. In this way, the main exhaust can expel one or more particulates removed from the polishing module 102 by the laminar air flow 206. Unfortunately, many particulates (e.g., particulates between polishing units and shields) may not be removed by the laminar air flow 206 because the laminar air flow 206 is merely directed in a plane substantially parallel with (e.g., above) the one or more polishing units within the polishing module 102. Accordingly, as provided herein purge air flow (e.g., directed towards the one or more polishing units) can be used to remove particulates from the polishing module 102, as illustrated in FIGS. 3, 4, and 5B. That is, the purge air flow can facilitate the removal of particulates that would otherwise not be removed with merely laminar air flow.

FIG. 3 illustrates an example 300 of a purge air component 302 configured to supply purge air flow 308 towards one or more polishing units within a polishing module 102 of a semiconductor polishing apparatus. The polishing module 102 can comprise a polishing head 104 and one or more polishing units, such as a first polishing unit 106, a second polishing unit 108, and/or a third polishing unit 110, configured to polish semiconductor wafers (e.g., through a chemical mechanical polishing technique). Particulates can accumulate within the polishing module 102 as a result of polishing semiconductor wafers. For example, material removed from semiconductor wafers and/or byproducts of chemicals used to polish semiconductor wafers can accumulate on polishing units, shields, polishing heads, a base plate, and/or other polishing components within the polishing module 102.

Accordingly, the purge air component 302 can be configured to clean the polishing module 102 of one or more particulates. In one example, the purge air component 302 can be configured to supply purge air flow 308 towards a polishing unit within the polishing module 102 of the semiconductor polishing apparatus (e.g., the first polishing unit 106, the second polishing unit 108, the third polishing unit 110, etc.). For example, the purge air component 302 can supply the purge air flow 308 through a purge air pipeline 316 (e.g., ductwork within the polishing module 102 comprising one or more vents through which purge air flow 308 can be directed towards the polishing unit (e.g., in a direction substantially perpendicular to or into the page) to create turbulence air flow between the polishing unit and one or more shields positioned relative to the polishing unit).

An auxiliary exhaust component 306 can be configured to exhaust at least some of the purge air flow 308 (e.g., and/or turbulence air flow created by the purge air flow 308) from the semiconductor polishing apparatus to expel one or more particulates removed from the polishing unit by the purge air flow 308 and/or the turbulence air flow. For example, the auxiliary exhaust component 306 can exhaust at least some of the purge air flow 308 through an auxiliary exhaust, such as a first auxiliary exhaust 310, a second auxiliary exhaust 312, a third auxiliary exhaust 314 and/or other auxiliary exhausts not illustrated. Pressure can be maintained, regulated, etc. within the polishing module 102 by exhausting the purge air flow 308. In this way, one or more particulates can be cleaned (e.g., expelled by the auxiliary exhaust component 306) from polishing components within the polishing component 102 using the purge air flow 308 while maintaining pressure within the polishing module 102.

Figure 8:
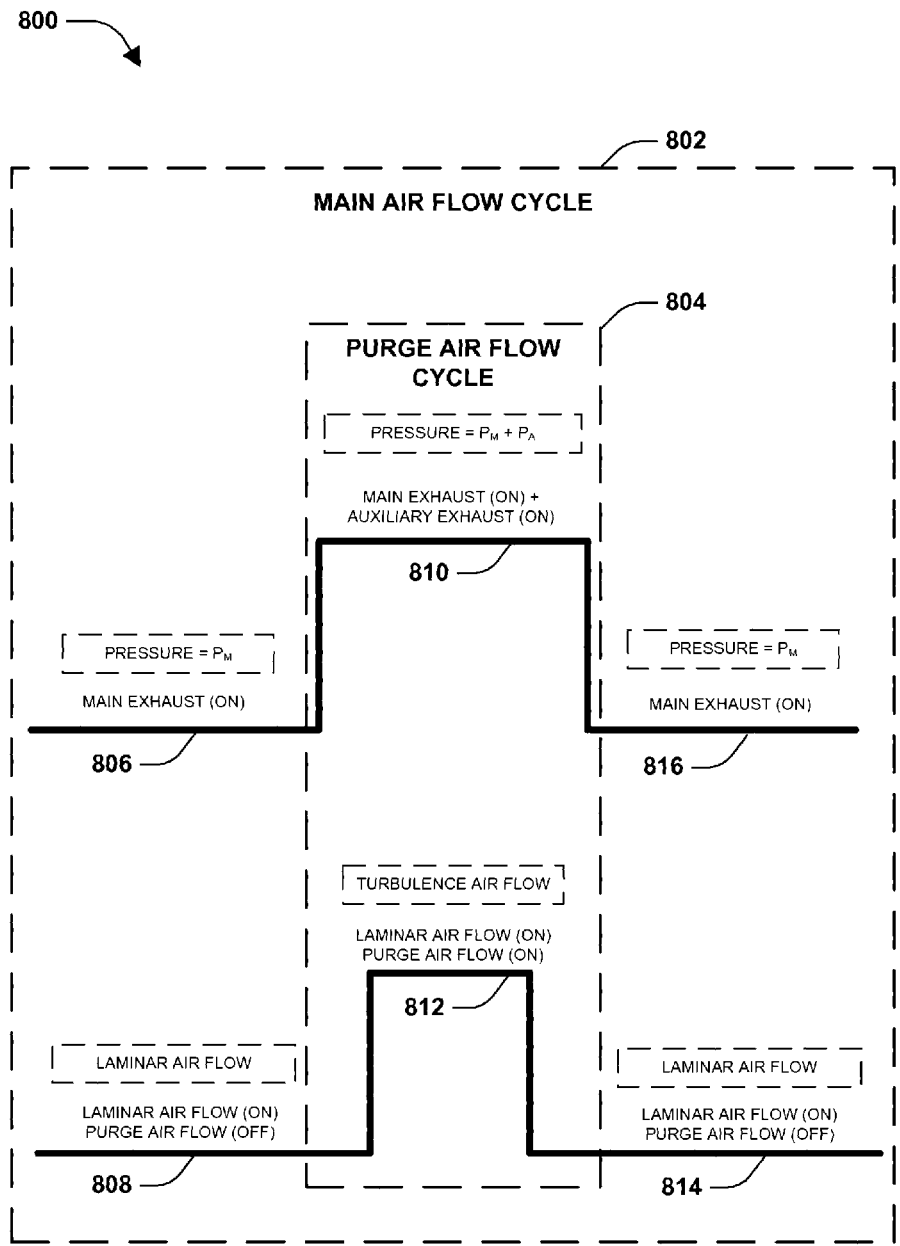
FIG. 8 is a flow diagram illustrating an example of a main air flow cycle and a purge air flow cycle.

A purge cycle component 304 can be configured to cycle the purge air flow 308 on and off according to a purge air flow cycle interval. For example, the purge cycle component 304 can invoke the purge air component 302 to supply purge air flow 308 into the polishing component 102 for about 1 minute out of every 10 minutes (e.g., when the semiconductor polishing apparatus is in an idle state). It can be appreciated that an example of a purge air flow cycle interval is illustrated in FIG. 8.

The purge cycle component 304 can be configured to cycle the auxiliary exhaust component 306 between an on state and an off state according to an auxiliary exhaust cycle interval. For example, the purge cycle component 304 can invoke the auxiliary exhaust component 306 to exhaust at least some purge air flow for about 1.5 minutes out of every 10 minutes (e.g., during a time span overlapping at least a portion of the purge air flow cycle interval). It can be appreciated that an example of an auxiliary exhaust cycle interval is illustrated in FIG. 8. In this way, the purge cycle component 304 can cycle the purge air flow 308 and/or the auxiliary exhaust component 306 between on and off states (e.g., as a purge air flow cycle) to expel particulates removed from the polishing component 102 by the purge air flow 308. It can be appreciated that an example of a purge air flow cycle is illustrated in FIG. 8.

FIG. 4 illustrates an example of a system 400 for cleaning one or more particulates from a polishing module 102. The polishing module 102 can comprise a polishing head, one or more polishing units, one or more shields, and/or other polishing components configured to polish semiconductor wafers. Particulates can accumulate within the polishing module 102 as a result of semiconductor wafer polishing, which can interfere with semiconductor polishing (e.g., due to contamination). The system 400 can be configured to clean one or more particulates from the polishing module 102, such as from a polishing unit and/or one or more shields, using laminar air flow 206, purge air flow 308, and/or turbulence air flow resulting from the purge air flow 308.

The system 400 can comprise a laminar air component 202, a main exhaust component 204, a purge air component 302, an auxiliary exhaust component 306, and/or a purge cycle component 304. The laminar air component 202 can be configured to supply laminar air flow 206 directed in a plane substantially parallel to (e.g., across) one or more polishing units within the polishing module 102. The main exhaust component 204 can be configured to exhaust at least some of the laminar air flow 206. For example, a first main exhaust 120, a second main exhaust 122, and/or a third main exhaust 124 can exhaust at least some of the laminar air flow 206 to expel one or more particulates (e.g., airborne particulates above the one or more polishing units) removed by the laminar air flow 206. The purge cycle component 304 can be configured, in one example, to perform a main air flow cycle according to a particular order by turning on the main exhaust component 204, turning on the laminar air flow component 202, turning off the laminar air flow component 202, and turning off the main exhaust component 204 (e.g., by cycling the laminar air flow component 202 and/or the main exhaust component 204 between on and off states).

The purge air component 302 can be configured to supply purge air flow 308 towards one or more polishing units within the polishing module 102 (e.g., in a direction substantially perpendicular to or into the page). For example, the purge air component 302 can supply purge air flow 308 towards a polishing unit to create turbulence air flow between the polishing unit and one or more shields positioned relative to the polishing unit. The auxiliary exhaust component 306 can be configured to exhaust at least some of the purge air flow and/or the turbulence air flow to expel one or more particulates removed from the polishing module 102 by the purge air flow 308 and/or the turbulence air flow. For example, a first auxiliary exhaust 310, a second auxiliary exhaust 312, and/or a third auxiliary exhaust 310 can expel airborne particulates and/or particulates that are accumulated on polishing components within the polishing module 102.

The purge cycle component 304 can be configured to perform one or more purge air flow cycles (e.g., during the main air flow cycle). For example, the purge cycle component 304 can turn on the auxiliary exhaust component 306, turn on the purge air component 302, turn off the purge air component 302, and turn off the auxiliary exhaust component 306 (e.g., by cycling the auxiliary exhaust component 306 between an on state and an off state according to an auxiliary exhaust cycle interval and/or by cycling the purge air component 302 between an on state and an off state according to a purge air flow cycle interval). In this way, one or more particulates can be cleaned, removed, etc. from the polishing module 102.

FIG. 5A illustrates an example 500 of supplying laminar air flow 502 across a polishing unit 504. The polishing unit 504 can be configured to polish a semiconductor wafer (e.g., the semiconductor wafer can be rotated against a pad of the polishing unit 504, and the pad can be rotated as well), which can result in accumlation of particulates on and/or around the polishing unit 504 (e.g., particulates 512 on the polishing unit 504, a first sheild 506, and/or a second shield 508, etc.). Laminar air flow 502 can be supplied across the polishing unit 504 to remove particulates from the polishing unit 504, the first shield 506, the second shield 508, and/or other polishing components not illustrated. For example the laminar air flow 502 can be directed in a plane substantially parallel with the polishing unit 504. A main exhust 510 can be configured to exhust at least some of the laminar air flow 502 to expel one or more particulates removed by the laminar air flow 502. Unfortunately, the laminar air flow 502 may be inadequate for removing some particulates. For example, the laminar air flow 502 may not adequately remove particulates 512 between the polishing unit 504, the first shield 506, and/or the second shield 508 because the laminar air flow 502 is not directed towards the polishing unit 504, for example.

FIG. 5B illustrates an example 520 of supplying laminar air flow 502 and purge air flow 514 to clean a polishing unit 504 and/or other polishing components. The polishing unit 504 can be configured to polish a semiconductor wafer, which can result in accumulation of particulates on and/or around the polishing unit 504. Laminar air flow 502 can be supplied across a top side of the polishing unit 504 to remove one or more particulates. A main exhaust 510 can exhaust at least some of the laminar air flow 502 to expel one or more particulates removed by the laminar air flow 502.

Because the laminar air flow 502 may not remove some particulates, purge air flow 514 can be supplied towards the polishing unit 504 from a purge airflow port disposed above the polishing unit 504. The purge air flow 514 can result in turbulence air flow 516 in, around, and/or between, etc. the polishing unit 504, the first shield 506, and/or the second shield 508. An auxiliary exhaust 518 can be invoked to expel one or more particulates 512 removed by the purge air flow 514 and/or by the turbulence air flow 516. In this way, the laminar air flow 502, the purge air flow 514, and the turbulence air flow 516 can be used to remove particulates from the polishing unit 504, the first shield 506, the second shield 508, and/or other polishing components not illustrated.

One embodiment of cleaning a polishing module of a semiconductor polishing apparatus is illustrated by an exemplary method 600. At 602, the method starts. At 604, purge air flow can be supplied into the polishing module. The polishing module can comprise a polishing unit and one or more shields positioned relative to the polishing unit. The purge air flow can result in turbulence air flow in, around, and/or between, etc. the polishing unit and the one or more shields. In one example, the purge air flow can be supplied into a polishing module of a chemical mechanical polisher (CMP) responsive to the chemical mechanical polisher being in an idle state (e.g., a non-polishing state). An auxiliary exhaust component can be invoked to exhaust at least some of the turbulence air flow to remove one or more particulates from the polishing module (e.g., from the polishing unit and/or the one or more shields). In one example, the purge air flow can be cycled between an on state and an off state according to a purge air flow cycle interval. In another example, the auxiliary exhaust component can be cycled between an on state and an off state according to an auxiliary exhaust cycle. In this way, a purge air flow cycle can be performed.

Laminar air flow can be supplied into the polishing module in a plane substantially parallel with the polishing unit (e.g., the laminar air flow can be supplied across the polishing unit). A main exhaust component can be invoked to exhaust at least some of the laminar air flow to remove one or more particulates from the polishing module. In this way, particulates can be removed from the polishing module using the laminar air flow, the purge air flow, and/or the turbulence air flow. At 606, the method ends.

One embodiment of cleaning a polishing module of a semiconductor polishing apparatus is illustrated by an exemplary method 700. At 702, the method starts. At 704, a purge air flow cycle can be performed. That is, an auxiliary exhaust component can be turned on to exhaust turbulence air flow from a polishing module, at 706. The polishing module can comprise a polishing unit (e.g., a polishing pad) and/or one or more shields positioned relative to the polishing unit. At 708, purge air flow can be supplied into the polishing module. The purge air flow can result in, among other things, turbulence air flow between the polishing unit and the one or more shields. At 710, one or more particulates, removed from the polishing module by the turbulence air flow, can be expelled through the auxiliary exhaust component.

At 712, the purge air flow can be turned off after expiration of a purge air flow cycle interval (e.g., purge air flow on for 1 minute out of 10 minutes). At 714, the auxiliary exhaust component can be turned off after expiration of an auxiliary exhaust cycle interval (e.g., auxiliary exhaust component on for 1.5 minutes out of 10 minutes). In this way, the purge air flow cycle can be performed to remove one or more particulates from the polishing module. In one example, the purge air flow cycle can be performed in response to the polishing module being in an idle state (e.g., a non-polishing state).

In one example, one or more purge air flow cycles can be performed during a main air flow cycle. The main air flow cycle can comprise turning on a main exhaust component to exhaust laminar air flow from the polishing module. Laminar air flow directed in a plane substantially parallel to the polishing unit can be supplied into the polishing module. The laminar air flow can be turned off (e.g., upon expiration of a laminar air cycle interval). The main exhaust component can be turned off (e.g., upon expiration of a main exhaust cycle interval). In this way, the main air flow cycle and/or the one or more purge air flow cycles can be performed to clean the polishing module of particulates. At 716, the method ends.

FIG. 8 illustrates an example 800 of a main air flow cycle 802 and a purge air flow cycle 804. One or more purge air flow cycles can be performed during a main air flow cycle to clean a polishing module of particulates, for example. During the main air flow cycle 802, a main exhaust can be turned on and an auxiliary exhaust can be turned off, at 806, resulting in a pressure Pm within the polishing module. Laminar air flow can be turned on and purge air flow can be turned off, at 808. Turning the laminar air flow on can result in laminar air flow within the polishing module (e.g., directed in a plane substantially parallel to one or more polishing units within the polishing module). In this way, the main exhaust can exhaust at least some of the laminar air flow from the polishing module (e.g., based upon pressure Pm) to expel one or more particulates removed from the polishing module by the laminar air flow.

The purge air flow cycle 804 (e.g., and/or other purge air flow cycles not illustrated) can be performed during the main air flow cycle 802 (e.g., while the main exhaust and the laminar air flow are on). For example, an auxiliary exhaust can be turned on while the main exhaust is turned on, at 810, resulting in pressure Pm+Pa within the polishing unit. Purge air flow can be turned on while the laminar air flow is turned on, at 812. Turning the purge air flow on can result in turbulence air flow within the polishing module (e.g., directed towards the one or more polishing units). In this way, the auxiliary exhaust can exhaust at least some of the turbulence air flow from the polishing module (e.g., based upon pressure Pa) to expel one or more particulates removed from the polishing module by the turbulence air flow. The purge air flow can be turned off after expiration of a purge air flow cycle interval, at 814 (e.g., while the laminar air flow remains on). The auxiliary exhaust can be turned off after expiration of an auxiliary exhaust cycle interval, at 816 (e.g., while the main exhaust remains on). In this way, the purge air flow cycle 804 can be completed during the main air flow cycle 802. It may be appreciated that the illustrated ordering can be advantageous as an exhaust is generally turned on before a corresponding air flow is added to a polishing module, which can mitigate increasing a pressure inside the polishing module beyond a desired level. Nevertheless, other orderings of actions are contemplated and are not intended to be excluded from the scope of the appended claims.

According to one aspect of the instant disclosure, a method for cleaning a polishing module of a semiconductor polishing apparatus is provided. The method comprises supplying purge air flow into a polishing module comprising a polishing unit and one or more shields positioned relative to the polishing unit. The purge air flow can result in turbulence air flow between the polishing unit and the one or more shields.

According to one aspect of the instant disclosure, a system for cleaning a polishing unit of a semiconductor polishing apparatus is provided. The system comprises a purge air component configured to supply purge air flow towards a polishing unit within a semiconductor polishing apparatus. The system comprises an auxiliary exhaust component configured to exhaust at least some of the purge air flow from the semiconductor polishing apparatus to expel one or more particulates removed from the polishing unit by the purge air flow.

According to one aspect of the instant disclosure, a method for cleaning a polishing module of a semiconductor polishing apparatus is provided. The method comprises performing a purge air flow cycle comprising turning on an auxiliary exhaust component to exhaust turbulence air flow from a polishing module, the polishing module comprising a polishing unit and one or more shields positioned relative to the polishing unit. The purge air flow cycle also comprises supplying purge air flow into the polishing module, the purge air flow resulting in the turbulence air flow between the polishing unit and the one or more shields, and expelling, through the auxiliary exhaust component, one or more particulates removed from the polishing module by the turbulence air flow. The purge air flow cycle also comprises turning off the purge air flow after expiration of a purge air flow cycle interval; and turning off the auxiliary exhaust component after expiration of an auxiliary exhaust cycle interval.

Although the subject matter has been described in language specific to structural features and/or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

As used in herein "exemplary" means an example, instance, or illustration, and"or" is intended to mean an inclusive "or" rather than an exclusive "or". In addition, "a" and "an" as used herein may generally be construed to mean "one or more" unless specified otherwise or clear from context to be directed to a singular form. Also, at least one of A and B and/or the like generally means A or B or both A and B.

Also, although the application has been shown and described with respect to one or more implementations, equivalent alterations and modifications will occur to others skilled in the art based upon a reading and understanding of this specification and the annexed drawings. The application includes all such modifications and alterations. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function. In addition, while a particular feature of the application may have been disclosed with respect to only one of several implementations, such feature may be combined with one or more other features as may be desired and/or advantageous for any given or particular application. Furthermore, to the extent that "includes", "having", "has", "with" and/or the like are used herein, such terms are intended to be inclusive in a manner similar to "comprising."

What is claimed is:

1. A method for cleaning a polishing module of a semiconductor polishing apparatus, comprising:
    supplying laminar air flow into a polishing module comprising a polishing unit and one or more shields positioned relative to the polishing unit while a main exhaust is turned on, wherein the laminar air flow is supplied to a top side of the polishing unit;
    turning on an auxiliary exhaust while the main exhaust is turned on and concurrently with the supplying laminar air flow; and
    supplying purge air flow into the polishing module concurrently with the supplying laminar air flow and while the auxiliary exhaust is turned on, wherein the purge air flow is supplied to the top side of the polishing unit, wherein the purge air flow travels in a direction perpendicular to the laminar air flow, and wherein the purge air flow combines with the laminar air flow to result in turbulence air flow between the polishing unit and the one or more shields.

2. The method of claim 1, wherein the laminar air flow travels in a direction parallel to a top surface of a polishing pad of the polishing unit.

3. The method of claim 1, wherein the turning on an auxiliary exhaust increases a pressure within the polishing module.

4. The method of claim 1, wherein the supplying purge air flow comprises:
    cycling the purge air flow between an on state and an off state according to a purge air flow cycle interval.

5. The method of claim 1, further comprising:
    turning off the purge air flow; and
    turning off the auxiliary exhaust after the turning off the purge air flow, wherein the auxiliary exhaust is turned on for a duration in which the purge air flow is supplied into the polishing module, and wherein the main exhaust is turned on for a duration in which the auxiliary exhaust is turned on.

6. The method of claim 1, further comprising:
    cycling the auxiliary exhaust between an on state and an off state according to an auxiliary exhaust cycle interval.

7. The method of claim 1, further comprising:
    removing one or more particulates from the polishing unit through the auxiliary exhaust using the turbulence air flow.

8. The method of claim 1, further comprising:
    removing one or more particulates from the one or more shields through the auxiliary exhaust using the turbulence air flow.

9. The method of claim 1, wherein the supplying purge air flow comprises:
    supplying the purge air flow into the polishing module of a chemical mechanical polisher responsive to the chemical mechanical polisher being in an idle state.

10. The method of claim 1, wherein the purge air flow is directed through a plane perpendicular to a surface of the polishing unit that interfaces with a semiconductor wafer.

11. A method for cleaning a polishing module of a semiconductor polishing apparatus, comprising:
    performing a purge air flow cycle comprising:
        turning on an auxiliary exhaust, while a main exhaust is turned on, to exhaust turbulence air flow from a polishing module, the polishing module comprising a polishing unit and one or more shields positioned relative to the polishing unit, wherein the main exhaust is disposed below the polishing unit and the auxiliary exhaust is disposed below the main exhaust;

supplying purge air flow into the polishing module concurrently with supplying a laminar air flow into the polishing module, wherein the laminar air flow is introduced into the polishing module in a first direction and the purge air flow is introduced into the polishing module in a second direction that is not parallel to the first direction, and wherein the purge air flow combines with the laminar air flow to result in the turbulence air flow between the polishing unit and the one or more shields;

expelling, through the auxiliary exhaust, one or more particulates removed from the polishing module by the turbulence air flow;

turning off the purge air flow after expiration of a purge air flow cycle interval; and turning off the auxiliary exhaust after expiration of an auxiliary exhaust cycle interval.

12. The method of claim 11, further comprising:
performing one or more purge air flow cycles during a main air flow cycle.

13. The method of claim 12, further comprising:
performing the main air flow cycle comprising:
  turning on the main exhaust to exhaust the laminar air flow from the polishing module prior to turning on the auxiliary exhaust;
  supplying the laminar air flow while the main exhaust is turned on;
  turning off the laminar air flow; and
  turning off the main exhaust.

14. The method of claim 11, wherein the performing a purge air flow cycle, comprises:
performing the purge air flow cycle responsive to the polishing module being in an idle state.

15. The method of claim 11, wherein the purge air flow is directed through a plane perpendicular to a surface of the polishing unit that interfaces with a semiconductor wafer.

16. A method for cleaning a polishing module of a semiconductor polishing apparatus, comprising:
supplying a laminar air flow into a polishing module comprising a polishing unit while the polishing module has a first pressure and while a main exhaust is turned on, wherein the laminar air flow is supplied from a first port disposed to a side of the polishing unit, and wherein the laminar air flow travels in a first plane parallel to a surface of a polishing pad of the polishing unit that interfaces with a semiconductor wafer;

turning on an auxiliary exhaust while the main exhaust is turned on and concurrently with the supplying laminar air flow to increase a pressure within the polishing module from a first pressure to a second pressure after beginning to supply the laminar air flow and while concurrently supplying the laminar air flow; and after the polishing module has the second pressure, supplying a purge air flow into the polishing module while continuing to supply the laminar air flow and while the auxiliary exhaust is turned on, wherein the purge air flow is supplied from a second port disposed above the polishing unit, and wherein the purge air flow travels in a second plane perpendicular to the first plane to create turbulence air flow within the polishing module.

17. The method of claim 16, further comprising:
discontinuing the supplying a purge air flow into the polishing module while continuing to supply the laminar air flow into the polishing module.

18. The method of claim 17, further comprising:
reducing the pressure within the polishing module from the second pressure to the first pressure after the discontinuing the supplying a purge air flow.

19. The method of claim 16, wherein the supplying a purge air flow comprises:
supplying the purge air flow into the polishing module responsive to a chemical mechanical polisher of the polishing module being in an idle state.

20. The method of claim 16, further comprising:
removing one or more particulates from the polishing module using the turbulence air flow.

* * * * *